United States Patent
Kojo et al.

(10) Patent No.: US 6,800,223 B2
(45) Date of Patent: Oct. 5, 2004

(54) THERMOSETTING ELECTROCONDUCTIVE PASTE FOR ELECTROCONDUCTIVE BUMP USE

(75) Inventors: Hiroki Kojo, Tochigi-ken (JP); Hisashi Matsuno, Tochigi-ken (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 249 days.

(21) Appl. No.: 10/223,907

(22) Filed: Aug. 20, 2002

(65) Prior Publication Data

US 2003/0038280 A1 Feb. 27, 2003

Related U.S. Application Data

(60) Provisional application No. 60/314,688, filed on Aug. 24, 2001.

(51) Int. Cl.$^7$ .................................................. H01B 1/22
(52) U.S. Cl. ...................................................... 252/514
(58) Field of Search ............................. 252/514; 75/255

(56) References Cited

U.S. PATENT DOCUMENTS

| 5,183,593 A | 2/1993 | Durand et al. |
| 6,010,769 A | 1/2000 | Sasaoka et al. |

FOREIGN PATENT DOCUMENTS

| EP | 0820217 A1 | 1/1998 |
| JP | 06-342977 | 12/1994 |
| JP | 2000-26116 | 9/2000 |

OTHER PUBLICATIONS

Patent Abstracts of Japan, vol. 2000, No. 08, Oct. 6, 2000 & JP 2000 138434 A (Denso Corp.), May 16, 2000 abstract.
Patent Abstracts of Japan, vol. 011, No. 383 (P–646), Dec. 15, 1987 & JP 62 150227 A (Hitachi Device Eng. Co. Ltd. et al.), Jul. 4, 1987 abstract.
Patent Abstracts of Japan, vol. 013, No. 431 (C–640), Sep. 26, 1989 & JP 01 165654 A (Sumitomo Bakelite Co. Ltd.), Jun. 29, 1989 abstract.
Database WPI, Week 198921, Derwent Publications Ltd., London, GB; AN 1989–156137 XP002217632 & JP 01 098674 A (Daido Tokushuko KK), Apr. 17, 1989 abstract.

*Primary Examiner*—Mark Kopec

(57) ABSTRACT

The invention is directed to a thermosetting electroconductive paste for forming electroconductive bumps at predetermined locations on at least one circuit layer that is laminated to an insulating layer. Upon lamination the electroconductive bumps penetrate the insulating layer forming an electrical connection to a second circuit layer. The paste comprises, based on total composition, 80 to 90 wt % electroconductive powders comprising at least a first and second electroconductive metal powder of which packing densities are in the range of 20% or less of the average density (sp. gr.) of metal for the first powder and 20 to 40% of the average density (sp. gr.) of metal for the second powder; and 10 to 20 wt % epoxy resin, curing agent, and solvent.

3 Claims, No Drawings

THERMOSETTING ELECTROCONDUCTIVE PASTE FOR ELECTROCONDUCTIVE BUMP USE

This application claims benefit of 60/314,688 filed on Aug. 24, 2001.

TECHNICAL FIELD OF THE INVENTION

This invention relates to thermosetting electroconductive paste suitable for formation of conductive bumps at predetermined locations on a printed circuit layer for the purpose of making a connection by throughhole-type conductive bumps between circuit layers. It is especially useful in printed circuit boards or multi-layer printed circuit boards.

BACKGROUND OF THE INVENTION

A simple manufacturing method for printed circuit boards is disclosed in Japanese Patent Application Disclosure (Kokai) H6-342977A (1994), wherein substantially-conical electroconductive bumps connect upper and lower circuit layers constituting a structure on the printed circuit board. According to this method, conical-like electroconductive bumps are formed by a printing method on electroconductive metallic foil with an electroconductive composition comprising a mixture of electroconductive powder with thermosetting binder resin or thermoplastic resin by penetrating the insulation sheet comprising a synthetic resin sheet, superposing electroconductive metallic foil and compressing to laminate the layers as one unit (laminate body is compressed without modification, or it is heated and compressed), the tip of the bump undergoes plastic deformation and has satisfactory adhesion and bonding with opposite electroconductive metallic foil with which it is in contact, thus enabling formation of an electrical connection between the upper and lower circuit layers. Consequently, with respect to the bump, after compression of the laminate layers, a highly reliable electrical contact and strong adhesive strength with the electroconductive metallic foil are required. The electroconductive composition is prepared by mixing electroconductive powder, e.g. gold, silver, copper, solder powder, alloy powder, or mixtures thereof, with a thermosetting binder, e.g. polycarbonate resin, polysulfone resin, polyester resin, phenoxy resin, phenolic resin, and polyimide resin.

An improved electroconductive paste composition for electroconductive bump use is sought which would exhibit a highly reliable electrical contact and a strong adhesive strength with an electroconductive metallic foil. This invention fills such a need.

SUMMARY OF THE INVENTION

The invention is directed to a thermosetting electroconductive paste for forming electroconductive bumps at predetermined locations on at least one circuit layer that is laminated to an insulating layer wherein upon lamination the electroconductive bumps penetrate the insulating layer forming an electrical connection to a second circuit layer wherein the paste comprises, based on total composition, 80 to 90 wt % electroconductive powders comprising at least a first and second electroconductive metal powder of which packing densities are in the range of 20% or less of the average density (sp. gr.) of metal for the first powder and 20 to 40% of the average density (sp. gr.) of metal for the second powder; and 10 to 20 wt % epoxy resin, curing agent, and solvent.

The invention is further directed to a thermosetting electroconductive paste, wherein the electroconductive powders described above comprise 25 to 75 wt % flake silver powders having a packing density of 3 to 3.5 g/ml, and an average particle size of 2~4.5 μm and 25~75 wt % silver powders being aggregate of spherical silver particles, having packing density of 0.7~1.7 g/ml and average particle size of 1.5~3.5 μm.

The invention is still further directed to a thermosetting electroconductive paste as described above, wherein its viscosity measured by a Brookfield viscometer at rotation of 0.5 rpm and 25° C. is in the range of 2200~3200 Pa.s.

DETAILED DESCRIPTION OF THE INVENTION

The objective of this invention is to provide a thermosetting electroconductive paste for electroconductive bump use which is able to form bumps possessing a very reliable electrical contact and a very strong adhesive strength to an electroconductive metallic foil. The thermosetting electroconductive paste used for the bump formation is suitable for a method of electrically connecting upper and lower circuit layers and forming a throughhole-type conductive member connection between the upper and lower circuit layers by forming substantially conical electroconductive bumps by a printing method on the electroconductive metallic foil. For example, this is achieved by using a penetrating insulation sheet comprising a synthetic resin sheet, further superposing an electroconductive metallic foil with electroconductive bumps formed thereon and compressing the sheets, usually by lamination, as a unit.

In order to satisfy the required properties, a thermosetting electroconductive paste was developed for electroconductive bumps for penetrating the insulating layers separated by a predetermined distance in a printed circuit board. The thick film composition contains about 80 to about 90 wt % electroconductive component comprising at least two kinds of electroconductive powder comprising a first electroconductive powder having a packing density of not more than 20% with respect to the average density (sp.gr.) and a second powder having a packing density in the range of about 20 to about 40% with respect to the average density (sp.gr.), wherein the remainder of components is at least a epoxy resin, curing agent, and solvent. A connection is provided by the substantially conical electroconductive bumps forming conductive member connections by penetrating the circuit layers constituting the structure of the printed circuit board. The bump, after penetration, is able to satisfy the requisites of highly reliable electrical contact with a very strong adhesive strength with the electroconductive metallic foil. This is accomplished by providing easier deformation of the electroconductive bumps at the time of compressing the layers during lamination to form one unit so that the contact surface area between the substantially conical electroconductive bump and the electroconductive metallic foil is increased.

In general, it is possible to use known electroconductive powders, such as gold, platinum, palladium, silver, copper, aluminum, nickel, tungsten, or alloy powder containing powder. Gold, platinum, and palladium powders are expensive. Copper and nickel powders have concerns regarding increase in surface resistance of the conductive powder by surface oxidation and the temperature dependence of the process increases because of the low melting point. For these reasons, use of silver powder in this invention is most desirable. It is possible to use silver powder of different shapes such as spherical (hereinafter termed aggregate powder) and flake. Such as an embodiment may comprise a combination of 25~75 wt % powder in flake form having packing density of 3~3.5 g/ml and average particle size of 2~4.5 μm, and 25~75 wt % aggregate powder having average particle size of 1.5~3.5 μm, packing density of 0.7~1.7 g/ml, being an aggregate of fine substantially-spherical particles. The symbol "~" herein means "to about".

Epoxy resin is preferred as a thermosetting binder component of the composition. Examples include bisphenol A epoxy resin, phenol novolak-type epoxy resin, and cresol novolak-type epoxy resin. Resins other than epoxy resins can be suitably blended therein according to need.

Curing agents can be used with no particular restrictions. Preferable curing agents include, for example, amine curing agents such as dicyandiamine, carboxylhydrazide, imidazole curing agents such as heptadecylimidazole, latent curing agents represented by acid anhydride, and modified phenolic resin.

Suggested solvents are, for example, aliphatic alcohol, e.g. ethanol, i-propanol, n-propanol, butanol, esters thereof, e.g. acetate, propionate and the like, Carbitol® solvent,,e.g. methyl carbitol, ethyl carbitol, butyl carbitol, butyl carbitol acetate and the like, cellosolve solvent, e.g. cellosolve, butyl cellosolve, isoamyl cellosolve, hexyl cellosolve, butyl cellosolve acetate and the like, ketone solvent, e.g. acetone, methyl ethyl ketone, 2-pentanone, 3-pentanone, cyclohexanone and the like, and hydrocarbon solvent, e.g. benzene, toluene, xylene, ethylbenzene, terpene, cyclohexane, methylcyclohexane, methylpentane and the like.

In a composition constituting silver powder, epoxy resin, curing agent, and solvent, by adjusting the shape and packing density of the silver powder; it is possible to attain electrical connection of high reliability by adhesion and bonding with the electroconductive metallic foil opposite to the bump tip, after compression of the laminate layers.

Because of the low packing density of the silver powder used in this invention, cured materials, after being formed and cured, have a lower density in comparison to a cured material containing silver powder with a high packing density, because a multiplicity of minute voids are formed in the low packing density cured material. Consequently, in this invention, silver powder of differing packing densities is used so that such multiplicity of minute voids is limited. This enables the formation of substantially-conical electroconductive bumps after curing.

The electroconductive bump deforms readily when there is compression of a laminate body that comprises a structure of an electroconductive metallic foil and an insulation sheet. For this reason, the contact surface area between the substantially-conical electroconductive bump and the electroconductive metallic foil is increased which makes it possible to achieve electrical connection of superior reliability.

Silver powder used in this invention constitutes a combination of flake powder and aggregate powder comprising an aggregate of fine substantially-spherical particles. The flake powder generally displays a lower conductive resistance than the spherical powder.

Nonetheless, when flake powder comprises 100 wt % of silver powder, the multiplicity of minute voids are not formed; therefore, a combination with silver powder possessing low packing density becomes necessary.

The proportion of flake powder and aggregate powder in silver powder is preferably a combination of about, based on weight of solids, 25–75 wt % flake powder and 25~75 wt % aggregate powder, very preferably, a combination of 40~60 wt % flake powder and 40~60 wt % aggregate powder.

When the proportion of flake powder is 75% or more, it becomes difficult to form a multiplicity of minute voids in the electroconductive paste; further, in the case of 25% or less, voids are formed in excess and the required hardness of the electroconductive bump is not obtained.

With respect to total of 100 part by weight for total silver powder, epoxy resin, and curing agent, the proportion of silver powder is preferably 80~90 part by weight, more preferably 83~88 part by weight. At 80 part by weight or less, it becomes difficult to form a multiplicity of minute voids in the aforementioned electroconductive bump. At 90 part by weight or more, paste viscosity suitable for printing was not obtainable.

Flake powder is sometimes characterized in terms of the ratio of the long diameter to the short diameter (aspect ratio). However, there is no need to specify aspect ratio in particular as long as D50% value (average particle size) as measured with a laser diffractive-type particle size distribution measurement unit is in the range of 2~4.5 μm.

The aggregate powder comprises an aggregate of fine substantially-spherical particles of about 0.1~0.5 μm in size. However, there is no need to specify the size of fine substantially-spherical particles as long as the average particle size is about 1.5~3.5 μm as measured with a laser diffractive-type particle size distribution measurement unit.

Packing density (g/ml) of the silver powder is measured with a packing density measurement unit. For example, 10 g of silver powder is placed in a 10-ml graduated glass cylinder and allowed to drop naturally from a height of 5 cm. After repeating this 8 times, the volume of silver powder is read and calculations are made from the volume (ml) of the bulk silver powder after 10 g/packing.

The proportion of the epoxy resin and curing agent for the various formulations are well within the art, as long as the hardness required by the electroconductive bump is attained after curing.

Viscosity ranges suitable for printing the thermosetting paste is preferably 2200~3200 Pa.s, most preferably 2400~3000 Pa.s. Viscosity is measured at 25° C. at 0.5 rpm rotation on a Brookfield viscometer.

When viscosity is 2200 Pa.s or less, the bump height of the electroconductive bump after printing and drying is low, penetration characteristics through a synthetic resin insulation sheet become poor. Further, in the case of 3200 Pa.s or more, height of the electroconductive bumps becomes too high after printing and drying, the tip of the bump breaks off at the time of penetration and affects the insulation characteristics of the insulation layer.

For example, a thermosetting silver paste in the proportion of, based on total composition, 85 wt % silver powder, 9 wt % epoxy resin, 1 wt % curing agent, and 5 wt % solvent, is manufactured by effecting preliminary mixing with a stirrer and thereafter mixing in a 3-roll mill. A printed circuit board using the thermosetting silver paste is fabricated by sandwiching a double-sided circuit board comprising the inner core layer between electro-conductive metallic foils from top and bottom after electroconductive bumps have been formed and penetration of a synthetic resin insulation sheet has been effected by laminating as one unit, and then patterning the surface of the electroconductive metallic foil by etching.

Reliability of connection between the upper and lower circuit layers in the resultant printed circuit board was confirmed by the resistance value change (%) with respect to the initial resistance value between the circuit layers, after implementing a hot oil test (after immersing in 260° C. oil bath for 10 sec, immediately immersing in 20° C. oil bath for 20 sec, cycle repeated 100 times) and a solder heat resistance test (floating in 260° C. solder bath for 20 sec).

EXAMPLES

Example 1

Mixing was effected in a 3-roll mill on a mixture of 64 wt % flake silver powder (packing density 3~3.5 g/ml, moreover, average particle size 2~4.5 µm), 21 wt % aggregate silver powder (packing density 0.7~1.7 g/ml, moreover, average particle size 2~4.5 µm), 15 wt % binder mixture comprising 9 wt % epoxy resin (Epoxy cresol novolac resin available from Sumitomo Chemical Co., LTD), 1 wt. % curing agent (Phenyl dihydroxymethlimidazole available from Shikoku Kasei Kabushiki Kaisha) and 5 wt % solvent (butyl carbitol acetate) to obtain a thermosetting silver paste. A substantially-conical electroconductive bump was formed by screen printing and curing at 150–170C for about 20 to 30 minutes.

Resistance value change was −2% after the hot oil test, resistance value change was −3% after the solder heat resistance test; satisfactory values were displayed in both cases.

Example 2

Mixing was effected in a 3-roll mill on a mixture of 42.5 wt % flake silver powder (packing density 3~3.5 g/ml, moreover, average particle size 2~4.5 µm), 42.5 wt % aggregate silver powder (packing density 0.7~1.7 g/ml, moreover, average particle size 2~4.5 µm), 15 wt % binder as used in Example 1 comprising mixture of epoxy resin, curing agent and solvent, to obtain thermosetting silver paste. Further, in order to obtain viscosity suitable for printing as in Example 1, 0.3 wt % solvent was added to adjust viscosity. This thermosetting silver paste was formed into substantially-conical electroconductive bump by screen printing and curing as given in Example 1.

Resistance value change was −2% after the hot oil test, resistance value change was 0% after the solder heat resistance test; satisfactory values were displayed in both cases.

Example 3

Mixing was effected in a 3-roll mill on a mixture of 21 wt % flake silver powder (packing density 3~3.5 g/ml, moreover, average particle size 2~4.5 µm), 64 wt % aggregate silver powder (packing density 0.7~1.7 g/ml, moreover, average particle size 2~4.5 µm), 15 wt % binder used in Example 1 comprising mixture of epoxy resin, curing agent and solvent to obtain thermosetting silver paste. Further, in order to obtain viscosity suitable for printing as in Example 1, 0.5 wt % solvent was added to adjust viscosity. The thermosetting silver paste was formed into substantially-conical electroconductive bump by screen printing.

Resistance value change was −3% after the hot oil test, resistance value change was 1% after the solder heat resistance test; satisfactory values were displayed in both cases.

Comparative Example 1

Mixing was effected in a 3-roll mill on a mixture of 51 wt % flake silver powder (packing density 3~3.5 g/ml, moreover, average particle size 2~4.5 µm), 34 wt % spherical powder (packing density 5~6 g/ml, moreover, average particle size 4.5~6.5 µm), 15 wt % binder as used in Example 1, comprising mixture of epoxy resin, curing agent and solvent, to obtain thermosetting silver paste. This thermosetting silver paste was formed into substantially-conical electroconductive bump by screen printing and curing as found in Example 1.

Maximum resistance value change was 90% after the hot oil test, resistance value change increased from the 50th cycle after the solder heat resistance test to maximum of 87%; abnormally high values were displayed.

What is claimed is:

1. Thermosetting electroconductive paste for forming at least one circuit layer that is laminated to an insulating layer wherein upon lamination the electroconductive bumps penetrate the insulating layer forming an electrical connection and wherein the bumps comprise, based on total composition, (a) 80 to 90 wt % electroconductive powders comprising at least a first and second electroconductive powder of which packing densities are in the range of 20% or less of the average density (sp.gr.) for the first powder and 20 to 40% of the average density (sp.gr.) for the second powder and (b) 10 to 20 wt % epoxy resin, curing agent, and solvent.

2. The thermosetting electroconductive paste of claim 1, wherein the electroconductive powders comprise 25 to 75 wt % flake silver powder having packing density of 3 to 3.5 g/ml, and an average particle size of 2 to 4.5 µm and 25 to 75 wt % aggregate silver powder having a packing density of 0.7 to 1.7 g/ml and an average particle size of 1.5 to 3.5 µm.

3. The thermosetting electroconductive paste of claim 2, wherein the viscosity of the paste measured by a Brookfield viscometer at rotation of 0.5 rpm and 25 C is in the range of 2200 to 3200 Pa.s.

* * * * *